United States Patent [19]

Kitano et al.

[11] Patent Number: 5,357,416
[45] Date of Patent: Oct. 18, 1994

[54] VOLTAGE GENERATING CIRCUIT CAUSING NO THRESHOLD VOLTAGE LOSS BY FET IN OUTPUT VOLTAGE

[75] Inventors: Toshihiro Kitano; Takeshi Kajimoto, both of Hyogo, Japan

[73] Assignee: Mitsubishi Denki Kabushiki Kaisha, Tokyo, Japan

[21] Appl. No.: 71,498

[22] Filed: Jun. 4, 1993

[30] Foreign Application Priority Data

Jul. 27, 1992 [JP] Japan .................................. 4-199479

[51] Int. Cl.⁵ ........................................... H02M 3/18
[52] U.S. Cl. ...................................... 363/60; 323/313
[58] Field of Search .................. 363/60, 61; 307/296.2, 307/110; 320/2, 5; 323/312, 313

[56] References Cited

U.S. PATENT DOCUMENTS 4,229,667 10/1980 Heimbigner et al. ............ 307/296.2
4,346,310 8/1982 Carter ................................. 363/60 X
4,616,303 10/1986 Mauthe .................................. 363/60
4,803,612 2/1989 Skovmand ......................... 363/60 X

FOREIGN PATENT DOCUMENTS 2-126308 5/1990 Japan .

*Primary Examiner*—Steven L. Stephan
*Attorney, Agent, or Firm*—Lowe, Price, LeBlanc & Becker

[57] ABSTRACT

An improved substrate bias voltage generating circuit provided in a semiconductor device such as a DRAM is disclosed. In a conducting period of an NMOS transistor (8) provided in a last stage, a higher enough voltage than a source voltage (i.e. an output voltage $V_{BB}$) can be applied to a gate of the transistor (8). Loss for a threshold voltage of the transistor (8) does not occur in the output voltage $V_{BB}$; the substrate bias voltage $V_{BB}$ of a level $-V_{cc}$ can be generated.

11 Claims, 6 Drawing Sheets

VOLTAGE GENERATING CIRCUIT CAUSING NO THRESHOLD VOLTAGE LOSS BY FET IN OUTPUT VOLTAGE

BACKGROUND OF THE INVENTION

1. Field of the Invention

The present invention generally relates to voltage generating circuits, and more specifically to improvement of a voltage generating circuit formed in a semiconductor substrate. The present invention has particular applicability to a dynamic random access memory (DRAM).

2. Description of the Background Art

Recently, a power supply voltage level has been lowered under demands for high integration and reduced power consumption of a semiconductor device. Provision of a lower power supply voltage to a semiconductor device enables insulating films of a MOS transistor, a MOS capacitor and the like to be thinner, that leads to improvement of the integration and power consumption thereof.

The provision of a lower power supply voltage to a semiconductor device, however, brings about bad results to several voltage generating circuit provided in the semiconductor device. More specifically, a semiconductor device is generally provided with a substrate bias voltage generating circuit for biasing a semiconductor substrate to a prescribed polarity. Since the substrate bias voltage generating circuit is constituted by a charge pump circuit, loss in the bias voltage level can not be ignored if a power supply voltage is reduced. (This problem will be described later in detail.) Similarly, since a boosted voltage generating circuit provided in the semiconductor device is also constituted by a charge pump circuit, loss in a boosted voltage level can not be ignored if the power supply voltage is reduced.

Although the present invention is generally applicable to a voltage generating circuit provided in a semiconductor device, a case in which the present invention is applied to a dynamic random access memory (hereinafter referred to as a DRAM) will hereinafter be described.

FIG. 8 is a block diagram of a DRAM to which the present invention can be applied. Referring to FIG. 8, a DRAM 100 comprises a memory cell array 85 including a multiplicity of memory cells, an address buffer 81 receiving externally applied address signals A0 to An, a row decoder 82 and a column decoder 83 for designating respectively a row and a column of the memory cell array 85 in response to the received address signal, and a sense amplifier 84 for amplifying a data signal read out from the memory cell. Input data Di is applied through a data-in buffer 86. Output data Do is provided through a data-out buffer 87. The DRAM 100 comprises a clock generator 88 generating a clock signal for controlling various circuits provided therein.

The DRAM 100 further comprises a substrate bias voltage generating circuit (shown as "$V_{BB}$ generating circuits" in the figure) 89 for generating the aforementioned substrate bias voltage $V_{BB}$. The substrate bias voltage generating circuit 89 receives a clock signal generated from a ring oscillator not shown, and after being supplied with a power supply voltage Vcc, is continuously driven by the applied clock signal.

A boosted voltage generating circuit 93 is driven by an externally applied row address strobe signal /RAS. More specifically, an RAS input buffer 92 receives the externally applied signal /RAS to apply the received signal to the clock generator 88 and the boosted voltage generating circuit 93. The circuit 93 is driven by the applied signal, and generates a boosted voltage Vpp.

The DRAM 100 further comprises a boosted voltage generating circuit 96 supplying a boosted voltage Vpp to a word line (not shown) through the row decoder 82. The boosted voltage generating circuit 96 also receives a clock signal from the ring oscillator, not shown, to generate the boosted voltage Vpp. The boosted voltage Vpp is applied to a selected word line through the row decoder 82.

Each of the substrate bias voltage generating circuits 89, 93 and 95 and the boosted voltage generating circuit 96 shown in FIG. 8 comprises a charge pump circuit, and generates a desired voltage in response to an applied clock signal. The substrate bias voltage generating circuit has the following circuit structure, for example.

FIG. 6 is a schematic diagram of a substrate bias voltage generating circuit showing the background of the present invention. Referring to FIG. 6, a substrate bias voltage generating circuit 24 comprises inverters 1 and 2, PMOS capacitors 3 and 4, and PMOS transistors 5, 6 and 7. The inverters 1 and 2 respond to a clock signal $\phi 0$ to provide complimentary clock signals $\phi 1$ and $\phi 2$. Each of the PMOS transistors 5, 6 and 7 is assumed to have a threshold voltage Vthp.

FIG. 7 is a timing chart showing the operation of the substrate bias voltage generating circuit 24 shown in FIG. 6. Referring to FIGS. 6 and 7, the operation of the substrate bias voltage generating circuit 24 will be described.

At a time t1, the output signal $\phi 1$ of the inverter 1 rises from a ground potential (hereinafter referred to as a GND level) to a power supply voltage level (hereinafter referred to as a Vcc level). Here, the GND level corresponds to 0 volt. Although a gate voltage 6g of the transistor 6 tends to rise to the Vcc level because of the coupling of capacitor 4, it actually attains the voltage level Vthp, since the transistor 5 is rendered conductive. At the same time t1, the output signal $\phi 2$ of the inverter 2 falls from the Vcc level to the GND level, whereby gate and drain voltages of the transistor 7 are lowered because of the coupling of the capacitor 3, causing the transistor 7 to become conductive. The conduction of the transistor 7 causes charges of the substrate to be extracted through the transistor 7, and the extracted charges are held by the capacitor 3. The transistor 6 is turned off in response to the applied gate voltage Vthp.

At a time t2, the output signal $\phi 1$ of the inverter 1 falls from the Vcc level to the GND level. The gate voltage 6g of the transistor 6 attains Vthp—Vcc because of the coupling of the capacitor 4, and the transistor 6 is turned on. The extracted charges, the charges held by the capacitor 3, are led to the ground through the transistor 6. At this time, the transistor 7 is turned off by the rise of the gate and drain voltages, preventing the extracted charges from flowing back.

As described above, by the input clock signal $\phi 0$ rising and falling repeatedly, charges are extracted from the substrate, and finally the substrate potential $V_{BB}$ attains a level $-Vcc+Vthp$ as shown in FIG. 7.

Since the substrate bias voltage generating circuit 24 shown in FIG. 6 employs the transistor 7 having a gate and a drain commonly connected, the substrate potential $V_{BB}$ can not be lowered below the level $-V_{cc}+V_{thp}$, in principle. As has already been described, the loss for the voltage Vthp by the transistor 7, that is, the rise of i0 the substrate potential $V_{BB}$ for Vthp, is not preferable, in the light of a recent tendency for the level of the power supply voltage Vcc applied to a semiconductor device to be lowered. Since the level of the power supply voltage $V_{BB}$ is $-VCC+Vthp$, the output voltage level rises proportional to the fall of the level of the power supply voltage Vcc. In other words, as the power supply voltage level falls, the loss of the power supply voltage Vthp in the output voltage level can not become made light of.

SUMMARY OF THE INVENTION

An object of the present invention is to provide a voltage generating circuit causing no threshold voltage loss in an output voltage by a field effect transistor.

Another object of the present invention is to provide a substrate bias voltage generating circuit causing no threshold voltage loss in an output voltage by an MOS transistor.

Still another object of the present invention is to provide a boosted voltage generating circuit causing no threshold voltage loss in a output voltage by an MOS transistor.

Briefly, a voltage generating circuit in accordance with the present invention comprises a circuit generating first and second complementary clock signals, a first capacitor having the first electrode connected to receive the first clock signal, a first field effect transistor having its source electrode connected to the second electrode of the first capacitor, and having its drain electrode connected to an output node, a second capacitor having the first electrode connected to receive the second clock signal, and a second field effect transistor having its gate electrode connected to the second electrode of the second capacitor, and connected between the source electrode of the first field effect transistor and a power supply potential. The first and second field effect transistors have different conductivity types. The first field effect transistor has its gate electrode connected to the second electrode of the second capacitor.

In operation, since the gate electrode of the first field effect transistor is connected to the second electrode of the second capacitor, a voltage over a source voltage of the first field effect transistor is applied to the gate electrode of the first field effect transistor, whereby a desired voltage can be generated without a threshold voltage loss in the first field effect transistor.

According to another aspect of the present invention, a substrate bias voltage generating circuit includes a circuit generating first and second complementary clock signals, a first capacitor having the first electrode connected to receive the first clock signal, an NMOS transistor having its source electrode connected to the second electrode of the first capacitor, and having its drain electrode connected to an output node, a second capacitor having the first electrode connected to receive the second clock signal, a PMOS transistor having its gate electrode connected to the second electrode of the second capacitor, and connected between the source electrode of the NMOS transistor and a power supply potential, and a second PMOS transistor having its gate electrode connected to the power supply potential, and connected between the second electrode of the second capacitor and the power supply potential. The NMOS transistor has its gate electrode connected to the second electrode of the second capacitor.

According to still another aspect of the present invention, a boosted voltage generating circuit includes a circuit generating first and second complementary clock signals, a first capacitor having the first electrode connected to receive the first clock signal, a PMOS transistor having its source electrode connected to the second electrode of the first capacitor, and having its drain electrode connected to an output node, a second capacitor having the first electrode connected to receive the second clock signal, an NMOS transistor having its gate electrode connected to the second electrode of the second capacitor, and connected between the source electrode of the PMOS transistor and a power supply potential, and a second NMOS transistor having its gate electrode connected to the power supply potential, and connected between the second electrode of the second capacitor and the power supply potential. The PMOS transistor has its gate electrode connected to the second electrode of the second capacitor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
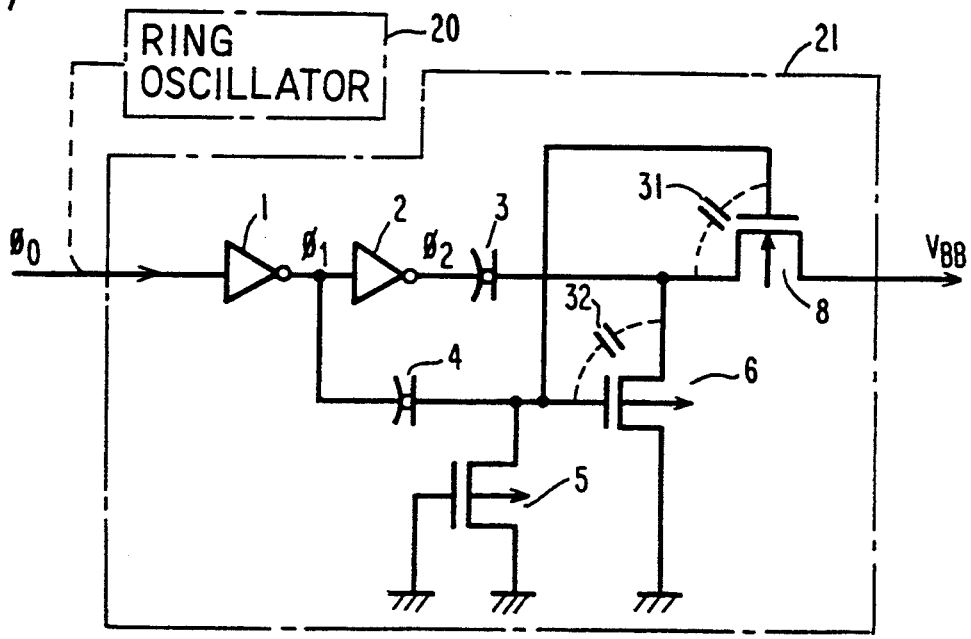
FIG. 1 is a schematic diagram of a substrate bias voltage generating circuit showing one embodiment of the present invention.

Referring to FIG. 1, a substrate bias voltage generating circuit 21 includes inverters 1 and 2, PMOS capacitors 3 and 4, PMOS transistors 5 and 6, and an NMOS transistor 8. The inverter 1 receives an output signal $\phi 0$. The clock signal $\phi 0$, depending on the situation, can be supplied from a ring oscillator 20 provided in the semiconductor substrate. The cascaded inverters 1 and 2 generate complementary clock signals $\phi 1$ and $\phi 2$. The capacitor 3 has one electrode connected to an output of the inverter 2. The capacitor 4 has one electrode connected to an output of the inverter 1.

The transistor 5 has its gate electrode grounded, and is connected between the other electrode of the capacitor 4 and a ground potential. The transistor 6 has its gate electrode connected to the other electrode of the capacitor 4, and is connected between the other electrode of the capacitor 3 and the ground potential. The transistor 8 has its source electrode connected to the other electrode of the capacitor 3, and its gate electrode connected to the other electrode of the capacitor 4. A substrate bias voltage $V_{BB}$ is generated through its drain electrode of the transistor 8.

Figure 3:
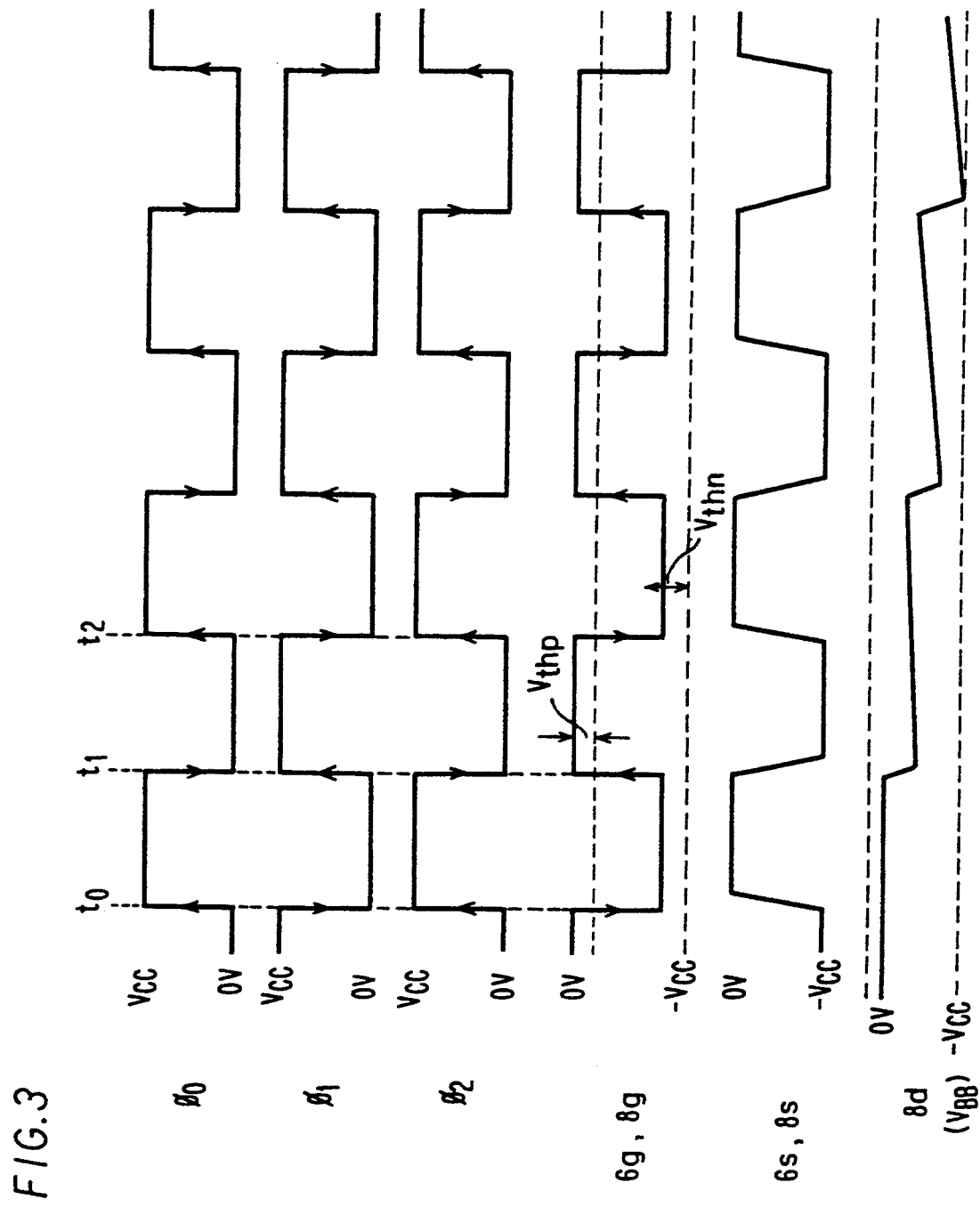
FIG. 3 is a timing chart showing the operation of the substrate bias voltage generating circuit shown in FIG. 1.

FIG. 3 is a timing chart showing the operation of the substrate bias voltage generating circuit 21 shown in FIG. 1. Referring to FIGS. 1 and 3, the operation of the substrate bias voltage generating circuit 21 will be described.

At the time t1, the output signal $\phi 1$ of the inverter 1 rises from a ground potential level (hereinafter referred to as a "GND level") to a power supply voltage level (hereinafter referred to as a "Vcc level"). Though gate voltages 6g and 8g of the transistor 6 and 8 tend to rise to the Vcc level because of the coupling of the capacitor 4, it actually becomes Vthp because the transistor 5 is rendered conductive. At the same time t1, the output signal $\phi 2$ of the transistor 2 falls down from the Vcc level to the GND level, and thus a source voltage 8s of the transistor 8 falls down to the $-$Vcc level because of the coupling of the capacitor 3. Therefore, the difference between the gate voltage 8g and source voltage 8s of the transistor 8, 8g-8s becomes Vthp$-(-$Vcc), whereby the transistor 8 is rendered conductive, and charges are extracted from the substrate. Since the transistor 6 is turned off in response to the gate voltage Vthp, the extracted charges are held in the capacitor 3.

At the time t2, the output signal $\phi 1$ of the inverter 1 falls from the Vcc level to the GND level. The gate voltages 6g, 8g of the transistors 6 and 8 become Vthp$-$Vcc by the coupling with the capacitor 4, and the transistor 6 is turned on. The extracted charges, that is, the charges held in the capacitor 3, are led to the ground through the transistor 6. Since the transistor 8 is turned off at this time, the charges held in the capacitor 3 cannot be brought back to the substrate through the transistor 8.

Figure 6:
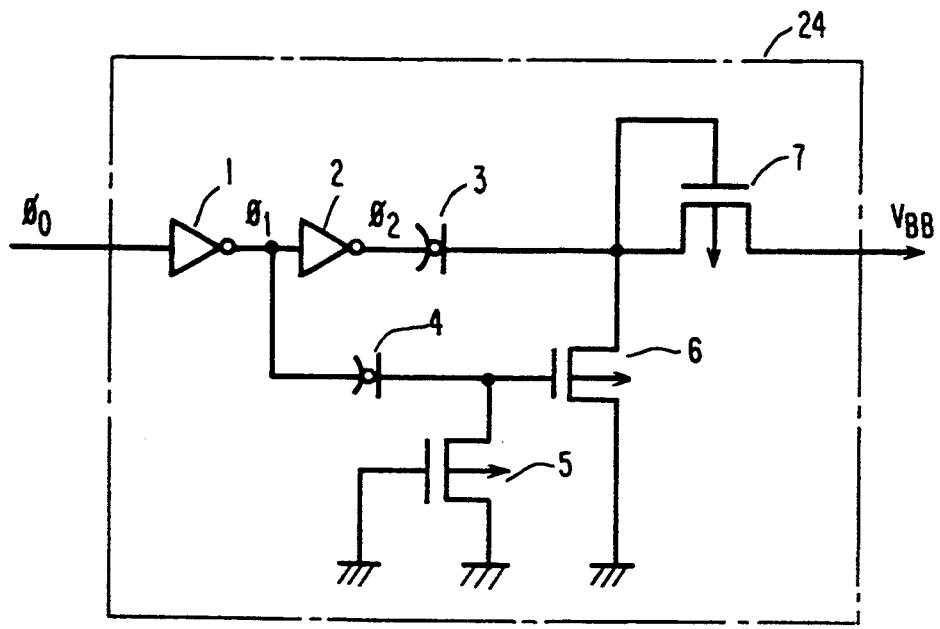
FIG. 6 is a schematic diagram of a substrate bias voltage generating circuit showing the background of the present invention.
Figure 7:
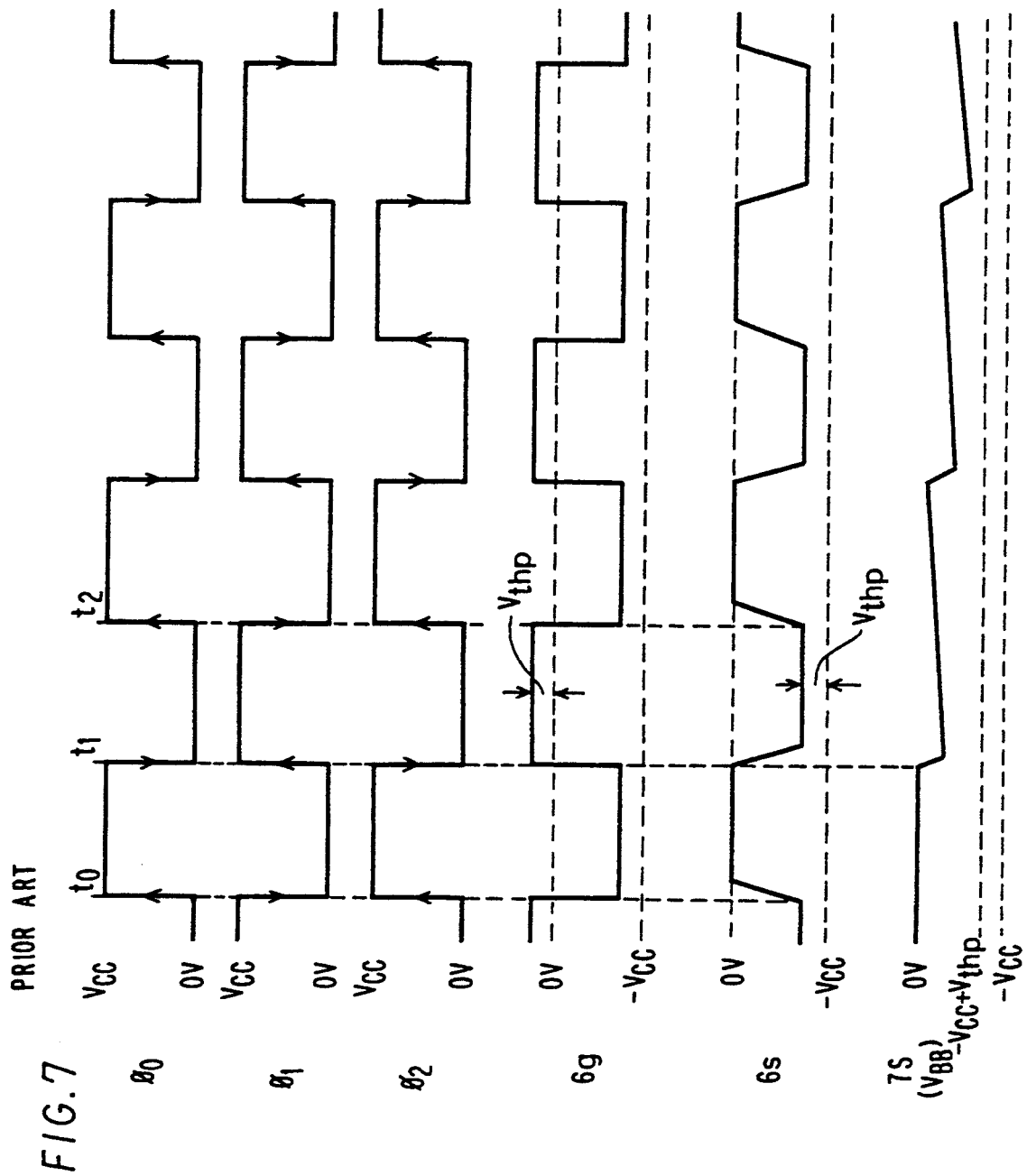
FIG. 7 is a timing chart showing the operation of the substrate bias voltage generating circuit shown in FIG. 6.

As described above, through repetition of rise and fall of the input clock signal $\phi 0$, the charges are extracted from the substrate, the substrate potential $V_{BB}$ is reduced, and finally the substrate potential $V_{BB}$ can attain the level $-$Vcc. When the charges are extracted from the transistor 8, the gate voltage 8g of the transistor 8 is higher enough than the drain voltage (i.e. the substrate potential), so that loss for the threshold voltage Vthp generated in the conventional circuit 24 shown in FIG. 6 can be prevented, and the substrate potential $V_{BB}$ can attain the level $-$Vcc effectively.

The transistors 6 and 8 are so designed as to satisfy a relation Vthp (the threshold voltage of the transistors 5, 6) <Vthn (the threshold voltage of the transistor 8), even when the drain voltage (i.e. the substrate potential) of the transistor 8 attains the lowest level $-$Vcc, thereby preventing undesired conduction of the transistor 8.

In the circuit shown in FIG. 1, in practice, a capacitance component 31 is present between the gate electrode-source electrode of the transistor 8, and a capacitance component 32 between the source electrode-gate electrode of the transistor 6. Through the repetition of rise and fall of the input clock signal $\phi 0$, the gate voltage of the transistor 6 may fall excessively because of the presence of these capacitance components 31 and 32. When the gate voltage of the transistor 6 falls excessively, the transistor 6 cannot be completely turned off, and thus charges can be returned back from the ground. More specifically, a back flow of charges through the transistor 6 occurs, and an effective pumping operation cannot be performed. An additional circuit shown in FIG. 2 is provided to solve this problem.

Figure 2:
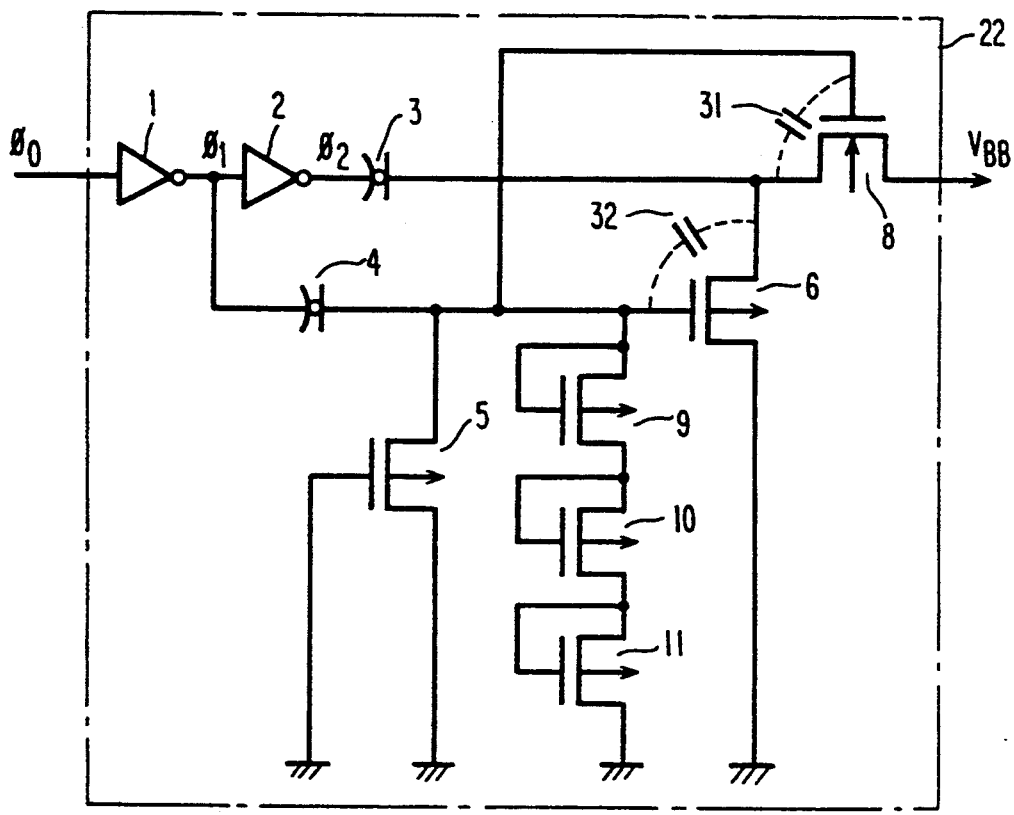
FIG. 2 is a schematic diagram of a substrate bias voltage generating circuit showing another embodiment of the present invention.
Figure 4:
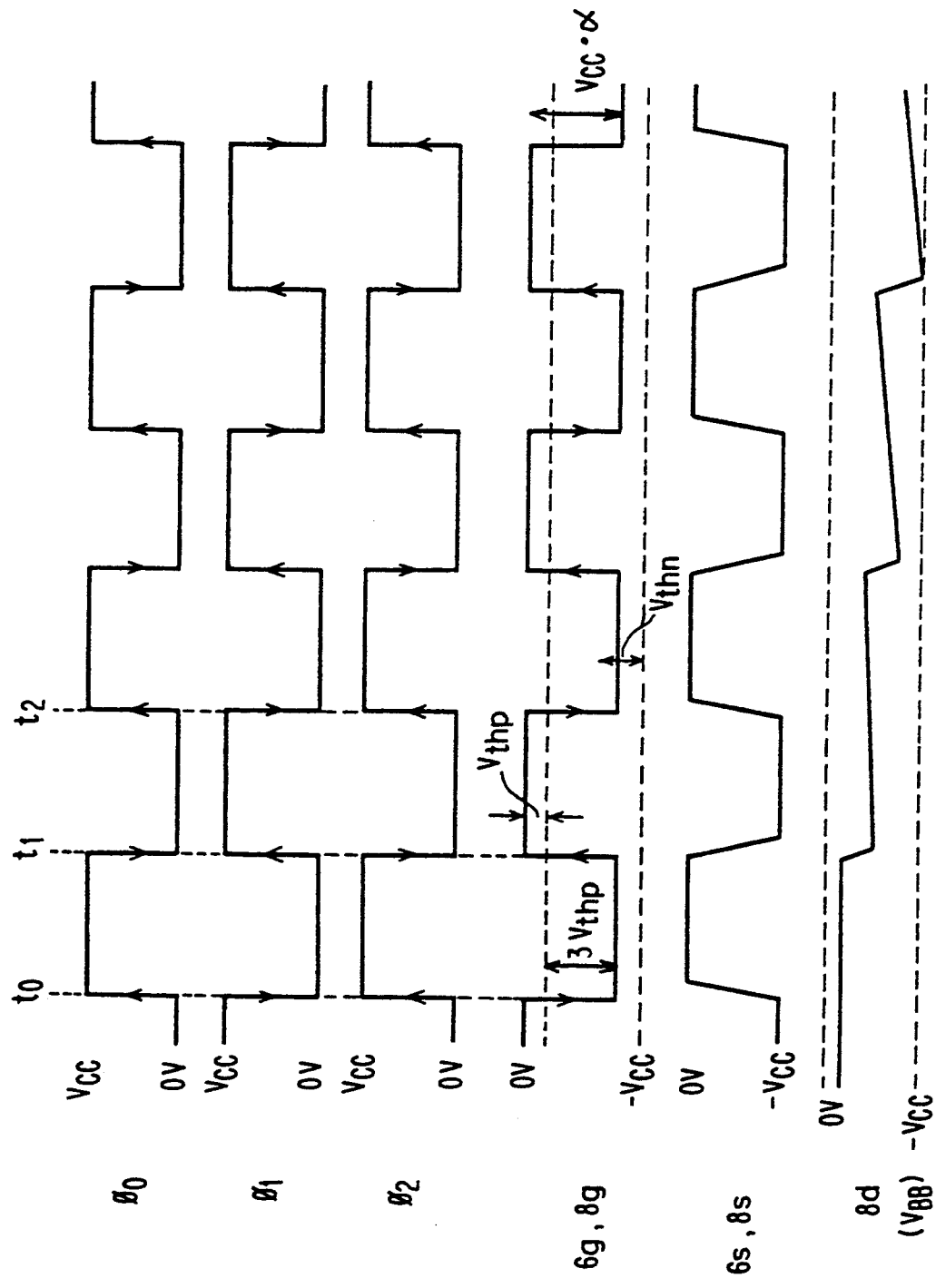
FIG. 4 is a timing chart showing the operation of the substrate bias voltage generating circuit shown in FIG. 2.

FIG. 2 is a schematic diagram of a substrate bias voltage generating circuit showing another embodiment of the present invention. Referring to FIG. 2, a substrate bias voltage generating circuit 22 includes, in addition to the circuit 21 shown in FIG. 1, PMOS transistors 9, 10 and 11 serially connected between the other electrode of the capacitor 4 and the ground potential. Each of the transistors 9, 10 and 11 has its gate electrode connected to a corresponding drain electrode. These transistors serve as a clamp circuit for limiting the gate voltage of the transistor 6 so as to exceed a level 3 Vthp. This clamp circuit enables the gate voltage of the transistor 6 to be held within a range over the level $-3$ Vthp, independently of effects of the capacitance components 31 and 32 (see FIG. 4), preventing the back flow of charges through the transistor 6. Consequently, an effective pumping operation can be carried out.

Although the three PMOS transistors 9, 10 and 11 are provided as a clamp circuit in the example shown in FIG. 2, the number of PMOS transistors n is generally determined to satisfy the following inequality under the condition of turning off of the transistor 6.

$$\text{Vthp} < (\text{Vthp} \times n) + \text{Vcc} \times \alpha \qquad (1)$$

Here $\alpha$ is a voltage transfer ratio of the capacitor 4.

In FIGS. 1 and 2, the examples are shown in which the present invention is applied to a substrate bias voltage generating circuit. The substrate bias voltage generating circuits 21 and 22 can generate an output voltage which finally attains the level $-$Vcc. Applying the present invention to a boosted voltage generating circuit, the boosted voltage generating circuit 23 shown in FIG. 5 can be obtained.

Figure 5:
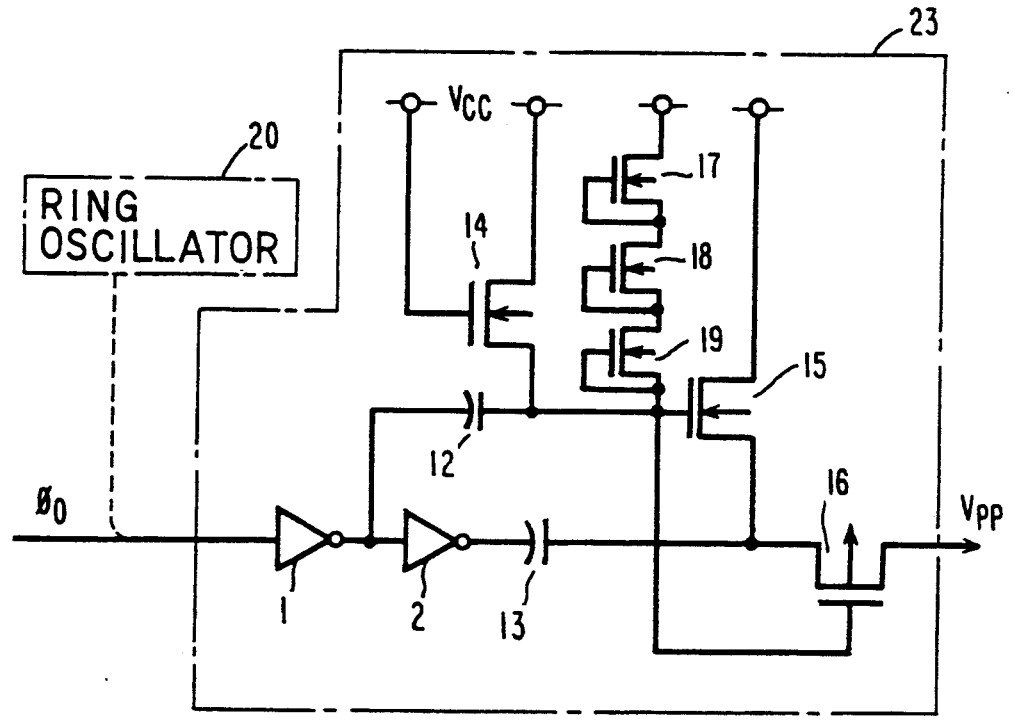
FIG. 5 is a schematic diagram of a boosted voltage generating circuit showing still another embodiment of the present invention.

FIG. 5 is a schematic diagram of a boosted voltage generating circuit showing still another embodiment of the present invention. Referring to FIG. 5, a boosted voltage generating circuit 23 includes the inverters 1 and 2, NMOS capacitors 12 and 13, NMOS transistors 14, 15, 17, 18 and 19, and a PMOS transistor 16. The transistors 17, 18 and 19 constituting a clamp circuit are provided for preventing adverse effects of capacitance components of the transistors 15 and 16, as in the circuit 22 shown in FIG. 2. When the capacitance components in the transistors 15 and 16 can be neglected, the transistors 17, 18 and 19 can be omitted.

The boosted voltage generating circuit 23 shown in FIG. 5 operates in principle similarly as the substrate bias voltage generating circuit 21 shown in FIG. 1. The boosted voltage generating circuit 23 provides a boosted voltage Vpp through the drain of the transistor 16.

Figure 8:
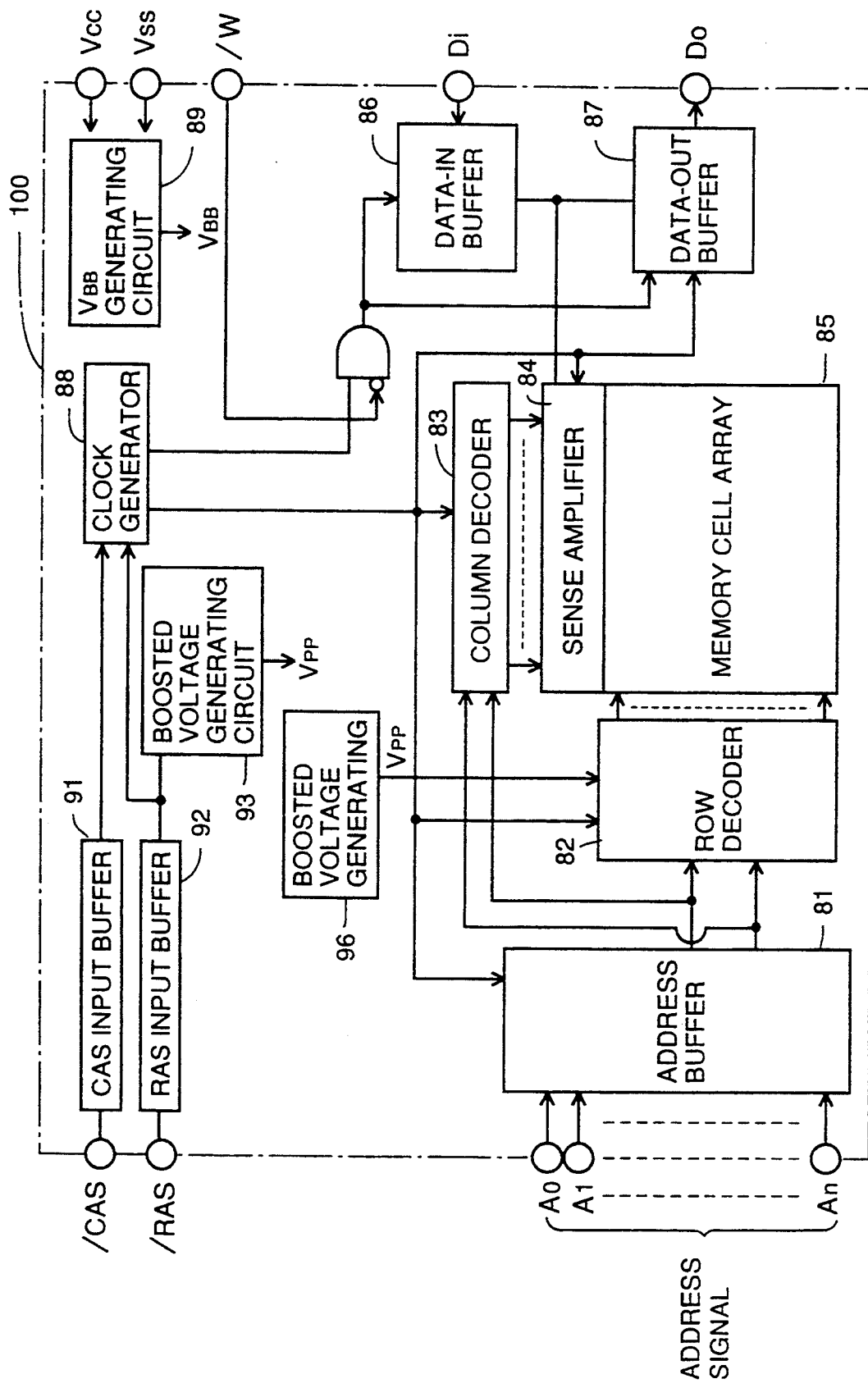
FIG. 8 is a block diagram of a DRAM to which the present invention can be applied.

Either of the substrate bias voltage generating circuits 21 and 22 shown in FIGS. 1 and 2 can be used as the $V_{BB}$ generating circuit 89, 93 or 95 in the DRAM 100 shown in FIG. 8. The boosted voltage generating circuit 23 shown in FIG. 5 can be used as the boosted voltage generating circuit 96 in the DRAM 100 shown in FIG. 8. In the circuits 21 and 22 shown in FIGS. 1 and 2, since the gate electrode of the transistor 8 in the output stage can be supplied with a voltage higher enough than the source voltage, loss for the threshold voltage Vthn of the transistor 8 does not occur in the output voltage $V_{BB}$. As a result, the substrate bias voltage $V_{BB}$ of the level $-Vcc$ is generated. Similarly, in the boosted voltage generating circuit 23 shown in FIG. 5, loss for the threshold voltage Vthp of the transistor 16 in the last stage does not occur in the output voltage Vpp, whereby the boosted voltage Vpp of a preferable level can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage generating circuit generating a voltage of a predetermined polarity through an output node, comprising:

means for generating first and second complementary clock signals;

first capacitor means having first and second electrodes, the first electrode being connected to receive the first clock signal;

a first field effect transistor having its source electrode connected to the second electrode of said first capacitor means, and its drain electrode connected to said output [note]node;

second capacitor means having first and second electrodes, the first electrode being connected to receive the second clock signal; and a second field effect transistor having its gate electrode connected to the second electrode of said second capacitor means, and a first electrode of said second field effect transistor connected to the source electrode of said first field effect transistor and a second electrode of said second field effect transistor connected to a power supply potential;

wherein said first and second field effect transistors have different conductivity types, respectively, and said first field effect transistor has its gate electrode connected to the second electrode of said second capacitor means.

2. The voltage generating circuit according to claim 1, further comprises potential limiting means connected between the second electrode of said second capacitor means and the power supply potential for limiting a potential of the second electrode of said second capacitor means within a prescribed range.

3. The voltage generating circuit according to claim 2, wherein
said potential limiting means comprises upper limiting means for limiting a potential of the second electrode of said second capacitor means to a potential under a predetermined upper limit level.

4. The voltage generating circuit according to claim 3, wherein
said potential limiting means further comprises lower limiting means for limiting a potential of the second electrode of said second capacitor means to a potential over a predetermined lower limit level.

5. The voltage generating circuit according to claim 4, wherein
said lower limiting means comprises diode clamp circuit means connected between the second electrode of said second capacitor means and the power supply potential.

6. The voltage generating circuit according to claim 3, wherein
said upper limiting means comprises a third field effect transistor having its gate electrode connected to the power supply potential, and connected between the second electrode of said second capacitor means and the power supply potential, said third field effect transistor having the same conductivity type as said second field effect transistor.

7. The voltage generating circuit according to claim 5, wherein
said diode clamp circuit means comprises a fourth field effect transistor having its gate electrode and its source electrode connected together, and connected between the second electrode of said second capacitor means and the power supply potential.

8. The voltage generating circuit according to claim 1, wherein
said predetermined polarity is negative,
said first field effect transistor comprises a first NMOS transistor, and
said second field effect transistor comprises a first PMOS transistor.

9. The voltage generating circuit according to claim 1, wherein
said predetermined polarity is positive,
said first field effect transistor comprises a second PMOS transistor, and
said second field effect transistor comprises a second NMOS transistor.

10. A substrate bias voltage generating circuit generating a negative substrate bias voltage through an output node, comprising:

means for generating first and second complementary clock signals;

a first capacitor having first and second electrodes, the first electrode being connected to receive the first clock signal;

an NMOS transistor having its source electrode connected to the second electrode of said first capacitor, and its drain electrode connected to said output node;

a second capacitor having first and second electrodes, the first electrode connected to receive the second clock signal;

a first PMOS transistor having its gate electrode connected to the second electrode of said second capacitor, and a first electrode of said first PMOS transistor connected to the source electrode of said NMOS transistor and a second electrode of said first PMOS transistor connected to a power supply potential; and a second PMOS transistor having its gate electrode connected to the power supply potential, and a first electrode of said second PMOS transistor connected to the second electrode of said second capacitor and a second electrode of said second PMOS transistor connected to the power supply potential;

wherein said NMOS transistor has its gate electrode connected to the second electrode of said second capacitor.

11. A boosted voltage generating circuit generating a positive boosted voltage through an output node, comprising:

means for generating first and second complementary clock signals;

a first capacitor having first and second electrodes, the first electrode being connected so as to receive the first clock signal;

a PMOS transistor having its source electrode connected to the second electrode of said first capacitor, and its drain electrode connected to said output node;

a second capacitor having first and second electrodes, the first electrode connected to receive the second clock signal;

a first PMOS transistor having its gate electrode connected to the second electrode of said second capacitor, and a first electrode of said first NMOS transistor connected to the source electrode of said PMOS transistor and a second electrode of said first NMOS transistor connected to a power supply potential; and a second NMOS transistor having its gate electrode connected to the power supply potential, and 9 first electrode of said second NMOS transistor connected to the second electrode of said second capacitor and a second electrode of said second NMOS transistor connected to the power supply potential;

wherein said PMOS transistor has its gate electrode connected to the second electrode of said second capacitor.

* * * * *